United States Patent
Ishii et al.

(10) Patent No.: US 8,785,865 B2
(45) Date of Patent: Jul. 22, 2014

(54) SEMICONDUCTOR DETECTOR FOR TWO-DIMENSIONALLY DETECTING RADIATION POSITIONS AND METHOD FOR TWO-DIMENSIONALLY DETECTING RADIATION POSITIONS USING THE SAME

(75) Inventors: Keizo Ishii, Miyagi (JP); Youhei Kikuchi, Miyagi (JP)

(73) Assignee: Tohoku University, Miyagi (JP)

( * ) Notice: Subject to any disclaimer, the term of this patent is extended or adjusted under 35 U.S.C. 154(b) by 704 days.

(21) Appl. No.: 13/132,601

(22) PCT Filed: Dec. 3, 2009

(86) PCT No.: PCT/JP2009/070353
§ 371 (c)(1),
(2), (4) Date: Jul. 19, 2011

(87) PCT Pub. No.: WO2010/064693
PCT Pub. Date: Jun. 10, 2010

(65) Prior Publication Data
US 2011/0284754 A1      Nov. 24, 2011

(30) Foreign Application Priority Data

Dec. 3, 2008   (JP) .................................. 2008-309169

(51) Int. Cl.
*G01T 1/24*       (2006.01)
*G01T 1/00*       (2006.01)
*H01L 31/108*    (2006.01)
*H01L 27/144*    (2006.01)
*H01L 31/02*      (2006.01)

(52) U.S. Cl.
CPC ............ *H01L 31/02024* (2013.01); *G01T 1/00* (2013.01); *H01L 31/108* (2013.01); *H01L 27/1446* (2013.01)
USPC ..................................... 250/370.01

(58) Field of Classification Search
CPC .......................................................... G01T 1/24
USPC ............... 250/370.1, 370.01, 370.09, 370.11, 250/338.4, 206.2
See application file for complete search history.

(56) References Cited

U.S. PATENT DOCUMENTS 5,444,234 A  *  8/1995  Hennerici et al. ......... 250/206.2
6,028,313 A  *  2/2000  McDaniel ............... 250/370.09
2005/0230627 A1  10/2005  Protic et al.

FOREIGN PATENT DOCUMENTS

JP       61-108930 A       5/1986
JP       S62-62075 A       3/1987

(Continued)

OTHER PUBLICATIONS

Rankowitz et al., "Positron scanner for locating brain tumors," IRE Int. Conv. Rec. 1962, 10 (Issue 9), pp. 49-56.
International Search Report (ISR) issued in PCT/JP2009/070353 (International application) mailed in Mar. 2010 for Examiner consideration.
International Preliminary Report on Patentability Chapter II (PCT/IPEA/409) issued in PCT/JP2009/070353 (International application) completed in Mar. 2011.

*Primary Examiner* — David Porta
*Assistant Examiner* — Faye Boosalis
(74) *Attorney, Agent, or Firm* — Chen Yoshimura LLP

(57) ABSTRACT

A semiconductor 2D position detector for two-dimensionally detecting positions of radiation is a Schottky diode comprising: a semiconductor substrate 2; a first to an nth (n is an integer of 2 or higher) stripe electrodes 3 arranged on the surface 2A of the semiconductor substrate 2 at given intervals in the X direction and in parallel to the Y direction; and an electrode 15 formed on the rear surface 2B of the semiconductor substrate 2. The top and the bottom ends of each of the stripe electrodes 3 are sequentially connected via a resistor 4, 5, and signals $V_1$ to $V_4$ output from the radiation 16 applied to the semiconductor substrate 2 are obtained from each of the both ends of the first and the nth stripe electrodes placed far left and right.

11 Claims, 14 Drawing Sheets

(56) References Cited

FOREIGN PATENT DOCUMENTS

| | | |
|---|---|---|
| JP | 4-122881 A | 4/1992 |
| JP | H11-23721 A | 1/1999 |
| JP | 11-316280 A | 11/1999 |
| JP | 2000-161911 A | 6/2000 |
| JP | 2000-340835 A | 12/2000 |
| JP | 2005-156252 A | 6/2005 |
| JP | 2005-523438 A | 8/2005 |
| JP | 2006-234661 A | 9/2006 |
| JP | 2007-109905 A | 4/2007 |
| JP | 2007-212415 A | 8/2007 |
| JP | 2008-116260 A | 5/2008 |

* cited by examiner

SEMICONDUCTOR DETECTOR FOR TWO-DIMENSIONALLY DETECTING RADIATION POSITIONS AND METHOD FOR TWO-DIMENSIONALLY DETECTING RADIATION POSITIONS USING THE SAME

TECHNICAL FIELD

The present invention relates to a semiconductor 2D position detector for two-dimensionally detecting radiation positions used preferably for physical instrumentation, positron emission tomographic apparatus (PET), etc., and a method for two-dimensionally detecting radiation positions using the same.

BACKGROUND OF THE INVENTION

A positron emission tomographic apparatus (PET) uses positron-emitting radionuclide to emit a positron, which then annihilates when colliding with an electron in a material and emits two gamma rays in exactly opposite directions, and detects the emitted gamma rays to obtain a nuclide distribution image (non-patent reference 1). A scintillator detector is generally used as a gamma ray detector for the positron emission tomographic apparatus. The scintillator detector receives light emitted by gamma ray detection with several photomultipliers, and determines with which scintillator the gamma ray was measured based on the intensity ratio of each light. The spatial resolution of a positron emission tomographic apparatus adopting this principle is several mm at the maximum.

Namely, spatial resolution of 1 mm or higher comparable to that of an X-ray computed tomographic apparatus (CT) cannot be obtained with a scintillator detector.

As a semiconductor detector for detecting light or particle beams, a semiconductor position detecting element (Patent reference 1) and a detector using a cadmium-telluride (CdTe) crystal, which has high absorption effect for gamma rays, are known (Patent reference 2). The CdTe detector has CdTe crystal semiconductor plates, on the surface and rear surface of which electrically conductive electrodes are formed, and electric signals are detected via an amplifier. The use of this semiconductor detector could downsize the detector, and even a 1 mm-size detector could be achieved. Consequently, it would be possible to achieve a semiconductor detector having the spatial resolution of 1 mm or lower when two or more such detectors are arranged. However, to obtain spatial resolution of 1 mm or lower by arranging ten 1 mm$^2$ detectors in the vertical and horizontal directions respectively, a total of 100 amplifiers are necessary. Since an enormous number of amplifiers are necessary, the detector of the above composition is not feasible.

To overcome the disadvantage described above, patent reference 2 discloses a detector that uses a 20 mm$^2$ semiconductor plate, for example, on whose rear surface an electrically conductive electrode is formed, and two-dimensionally detects gamma ray positions within the semiconductor plate using the ratio of electrical signals from four corners of electrically conductive resistive electrodes. With this detector, detection is realized when just four amplifiers are provided.

FIG. 12 illustrates the semiconductor 2D position detector 50 disclosed by patent reference 2. With this semiconductor 2D position detector 50, a thin semiconductor crystal plate 51 is made of a CdTe crystal. An electrically conductive resistive electrode 52 is formed on one of the surfaces of the thin semiconductor crystal plate, and, an electrically conductive electrode 53 is formed on the other surface.

To make the semiconductor crystal plate 51 made of a CdTe crystal into a Schottky type detector, an indium electrode 52 is formed on one surface, and a platinum electrode 53 is formed on the other surface. The indium electrode is made to have electrically conductive resistivity by depositing indium thinly i.e. 600 Å for example. This allows the indium-deposited surface of the semiconductor crystal plate 51 to have electrically conductive resistivity and operates as a Schottky type radiation detector.

At each of the four corners, namely A, B, C and D, of the semiconductor 2D position detector 50 a terminal is mounted. Each of the terminals is connected to an amplifier circuit 55, and the output signals generated at the four terminals, namely voltages $V_A$, $V_B$, $V_C$ and $V_D$, are used to find the calculated positional coordinates (X, Y) (hereafter called temporary positional coordinates) of the gamma ray on the semiconductor plate 51 as a function of $V_A$, $V_B$, $V_C$ and $V_D$, (Patent reference 2).

FIG. 13 illustrates the irradiation positions of radiation 57 in a conventional semiconductor 2D position detector 50. As shown in the figure, in order to examine the accuracy of detected positions of the conventional semiconductor 2D position detector 50, an alpha ray is irradiated by using a $^{241}$Am source to fifteen points of intersection 58 (X=7, 11, 15, 19, 23 and Y=6, 10, 14).

FIG. 14 shows the result of position detection conducted using the conventional semiconductor 2D position detector 50, namely temporary positional coordinates 59 calculated using output signals $V_1$ to $V_4$ generated at the four terminals. Despite that radiation was applied onto the surface of the semiconductor position detector 50 at equally spaced intervals, the positions expressed as temporary positional coordinates 59 and the actual radiation positions detected were found to be non-linear and asymmetrical. Such highly distorted distribution was insufficient to identify the detection positions of the radiation 57.

Patent reference 3 discloses a semiconductor 2D position detector that has a resistive layer on a semiconductor substrate having sides of a circular, instead of square, and it is described that the position of incidence of γ-rays without distortion can be detected by detecting current with the four vertices formed with each side used as output electrodes.

Patent reference 4 discloses a radiation position detector that detects 2D positions using a resistor connected by cascade connection. However, it has a very complicated circuit structure including two amplifiers to be connected to resistors, four A/D converters to be connected to the amplifiers, two position calculators, an adder, an amplitude discriminator, and a control signal generator.

Patent references 5 and 6 disclose the formation of a structure with linear resistance wires installed in parallel (Patent reference 5), and a matrix structure (Patent references 5 and 6), using CdTe, CdZnTe or BrTl as a semiconductor substrate used for a semiconductor 2D position detector. The detecting elements in Patent reference 6 are arranged in a 2D matrix state. In this case, a switching device and an amplifier must be installed for each of the detecting element, which results in a circuit structure as complicated as that of Patent reference 4.

Patent reference 7 discloses a semiconductor 2D position detector using Si as a semiconductor substrate with Al electrodes formed in stripes on the surface layer.

PRIOR ART DOCUMENTS

Patent Reference

[Patent reference 1] JP2000-161911A
[Patent reference 2] JP2008-116260A
[Patent reference 3] JP1987-62075B
[Patent reference 4] JP1999-23721A
[Patent reference 5] JP2006-234661A
[Patent reference 6] JP2007-109905A
[Patent reference 7] JP2000-340835A Non-Patent Reference

[Non-patent reference 1] S. Rankowitz et al., "Positron scanner for locating brain tumors," IRE Int. Cony. Rec. 1962, 10 (Issue 9), pp. 49-56

DISCLOSURE OF THE INVENTION

Problems to be Solved by the Invention

With a conventional semiconductor 2D position detector (Patent reference 2, for example), the positions found using signals and the actually detected radiation positions were non-linear and asymmetrical, and such distorted distribution was insufficient to identify the radiation detection positions. In addition, the electrode structure on the position detecting surface was made to be circular, for example, in the past to solve the above problem, thus making the detector to be impracticable (patent references 1 and 3, for example). Furthermore, when an amplifier circuit, etc. are directly attached to the rear surface of the detector, a radiation dead region appears, which is inappropriate as a detector for PET.

Another problem is that when resistance wires, etc. are arranged in stripes in the conventional semiconductor 2D position detector (Patent references 4, 5 and 7), it is impossible to detect the position of incidence of γ-rays without distortion with a simple structure.

To solve the above problems, the present invention provides a semiconductor 2D position detector for detecting the position of γ-rays two-dimensionally, achieving high positional accuracy, with the positions found simply by using four signals coinciding with the actual radiation detection positions.

Another objective of the present invention is to provide a method for detecting 2D positions of radiation using the above semiconductor 2D position detector.

Means to Solve the Problems

To achieve the first objective described above, the present invention provides a semiconductor position detector for detecting the 2D positions of radiation comprises: a semiconductor substrate; a first to an nth (n is an integer of 2 or higher) stripe electrodes installed on the surface of the semiconductor substrate at given intervals in the X direction and in parallel to the Y direction; a plurality of resistors connecting the top ends of the first to the nth stripe electrodes adjacent to each other; a plurality of resistors connecting the bottom ends of the first to the nth stripe electrodes adjacent to each other; a first terminal for signal output connected to the bottom end of the first stripe electrode via a resistor; a second terminal for signal output connected to the bottom end of the nth stripe electrode via connection, a fourth terminal for signal output connected to the top end of the first stripe electrode via a resistor; a third terminal for signal output connected to the top end of the nth stripe electrode via a resistor; and an electrode disposed on the rear surface of the semiconductor substrate, characterized in that the output signals from the radiation entering a given point of the semiconductor substrate are obtained from the first to the fourth terminals for signal output.

The second composition of the semiconductor position detector for two-dimensionally detecting radiation positions related to the present invention comprises: a semiconductor substrate; a first to an nth (n is an integer of 2 or higher) stripe electrodes installed on the surface of the semiconductor substrate at given intervals in the X direction and in parallel to the Y direction; a plurality of resistors connecting the top ends of the first to the nth stripe electrodes adjacent to each other; a plurality of resistors connecting the bottom ends of the first to the nth stripe electrodes adjacent to each other; a first terminal for signal output connected to the bottom end of the first stripe electrode via a resistor; a second terminal for signal output connected to the bottom end of the nth stripe electrode via a resistor; a fourth terminal for signal output connected to the top end of the first stripe electrode via a resistor; a third terminal for signal output connected to the top end of the nth stripe electrode via a resistor; and an electrode disposed on the rear surface of the semiconductor substrate, characterized in that the first to the nth stripe electrodes are formed with m pieces of strip electrodes arranged in the Y direction separated from each other, that the adjacent strip electrodes along the Y direction are connected via a resistor to form each stripe electrode, and that the output signals from the radiation irradiated to a given point of the semiconductor substrate are obtained from the first to the fourth terminals for signal output.

In the above composition, the resistors connecting the top ends of the adjacent stripe electrodes are preferably formed in a state in which their resistance value is adjustable.

In order to perform positional discrimination using formulae (3) and (4), which will be described later, the resistance ratio of the resistance value of each stripe electrodes and that of the resistor connecting the top ends and/or the bottom ends of the adjacent stripe electrodes preferably falls within the 10:1 to 100:1 range.

The first to the nth stripe electrodes are preferably separated from each other by groove extending in the Y direction. The strip electrodes forming each of the first to the nth stripe electrodes are preferably separated from each other by grooves extending in the X direction.

The stripe electrodes are Schottky type electrodes having high electrically conductive resistivity, and the electrodes disposed on the rear surface of the semiconductor substrate is an electrode having high electric conductivity may be used.

The semiconductor substrate is preferably made of CdTe, CdZnTe or BrTl, and the electrode is preferably made of indium or platinum.

The composition described above is preferably provided with an operation part that calculates radiation positions using output signals. The operation part calculates the temporary positional coordinates $(X_i, Y_j)$ of the radiation using formulae (1) and (2) shown below, assuming that the voltage output from the first to the fourth terminals for signal output as $V_1$, $V_2$, $V_3$ and $V_4$ respectively, and also calculates the detected positional coordinates $(X_p, Y_q)$ of the radiation based on the temporary positional coordinates $(X_1, Y_j)$ using formulae (3) and (4) shown below.

[Formula 1]

$$X_i = \frac{(V_2 + V_3) - (V_1 + V_4)}{V_1 + V_2 + V_3 + V_4} \quad (1)$$

[Formula 2]

$$Y_j = \frac{(V_4 + V_3) - (V_1 + V_2)}{V_1 + V_2 + V_3 + V_4} \quad (2)$$

[Formula 3]

$$X_p = f(X_i, Y_j) \quad (3)$$

[Formula 4]

$$Y_q = g(X_i, Y_j) \quad (4)$$

where, functions $f(X_i, Y_j)$ and $g(X_i, Y_j)$ of formulae (3) and (4) are found by irradiating the radiation spots on the stripe electrodes of the semiconductor 2D position detector in the Y direction at given intervals, calculating the temporary positional coordinate of each irradiation position, and then performing fitting, assuming a corrective function for the positional coordinate of each irradiation position and the temporary positional coordinate of each irradiation position, as functions for reproducing the positional coordinate of each radiation irradiation position.

It is also possible to calculate a corrected positional coordinate $(X_p, Y_q)$ of the radiation by calculating $Y_q$ using the formula (5) or (6) as shown below, assuming $X_p$ as $X_i$. This corrected positional coordinate may also be called a detected positional coordinate.

[Formula 5]

$$Y_q = g(X_i, Y_j) = d * \frac{Y_j}{aX_i^2 + bX_i + c} \quad (5)$$

where, coefficients a, b and c of the quadratic function are arbitrary constants, and d* is a normalization constant.

[Formula 6]

$$Y_q = g(X_i, Y_j) = \frac{Y_j}{d'}(a'X_i^2 + b'X_i + c') \quad (6)$$

where, coefficients a', b' and c' of the quadratic function are arbitrary constants, and d' is a normalization constant.

To achieve the second objective described above, the present invention provides a method for two-dimensionally detecting radiation positions is characterized in arranging a first to an nth (n is an integer of 2 or higher) stripe electrodes on the surface of a semiconductor substrate at given intervals in the X direction and in parallel to the Y direction, connecting all the top ends of the first to the nth stripe electrodes adjacent to each other via a resistor, connecting all the bottom ends of the first to the nth stripe electrodes adjacent to each other via a resistor, one end of the resistor is connected to the bottom end of the first stripe electrode whereas a first terminal for signal output is connected to the other end of the resistor, connecting one end of the resistor to the bottom end of the nth stripe electrode whereas a second terminal for signal output is connected to the other end of the resistor, connecting one end of the resistor to the top end of the first stripe electrode whereas a fourth terminal for signal output is connected to the other end of the resistor, connecting one end of the resistor to the top end of the nth stripe electrode whereas a third terminal for signal output is connected to the other end of the resistor, disposing an electrode on the rear surface of the semiconductor substrate, and obtaining the output signals from the radiation irradiated to the semiconductor substrate from the first to the fourth terminals for signal output.

In the above method, it is preferably forming the first to the nth stripe electrodes by m pieces of strip electrodes arranged in the Y direction separated from each other, and connecting the strip electrodes of each stripe electrode placed adjacent to each other along the Y direction via a resistor to fabricate each of the stripe electrodes.

In the above method, assuming the voltage output from the first to the fourth terminals for signal output as $V_1, V_2, V_3$ and $V_4$, the temporary positional coordinates of the radiation $(X_i, Y_j)$ may be calculated using the formulae (1) and (2) as shown above, and the detected positional coordinates $(X_p, Y_q)$ of the radiation may be calculated using formulae (3) and (4) as shown above.

It is also possible to calculate the detected positional coordinates $(X_p, Y_q)$ of the radiation using the formula (5) or (6) shown above, assuming $X_p$ as $X_i$.

A high-performance positron emission tomographic apparatus may be manufactured by installing one of the semiconductor 2D position detectors described above.

Effect of the Invention

Since the semiconductor 2D position detector for two-dimensionally detecting the position of radiation related to the present invention has only four terminals for signal output, significant reduction in the number of signal amplifiers is possible. Furthermore, multiple configuration of semiconductor 2D position detectors ensures three-dimensional identification of detected positions of radiation at the accuracy of 1 mm or higher, and thus the detector is applicable to a positron emission tomographic apparatus having the spatial resolution of 1 mm or higher. In addition, since the whole face of the semiconductor detector is detection-sensitive, a detector block created by multiplying the detector does not have a dead zone insensitive to radiation, hence the block is suitable for detectors for PET.

According to the method for two-dimensionally detecting radiation positions of the present invention, signals from the four terminals for signal output of a plurality of stripe electrodes can be calculated at the time of application of radiation, and by further performing corrective calculations, the radiation irradiation positions can be identified two-dimensionally at the accuracy higher than 1 mm.

DESCRIPTION OF THE REFERENCE NUMERALS

Figure 1:
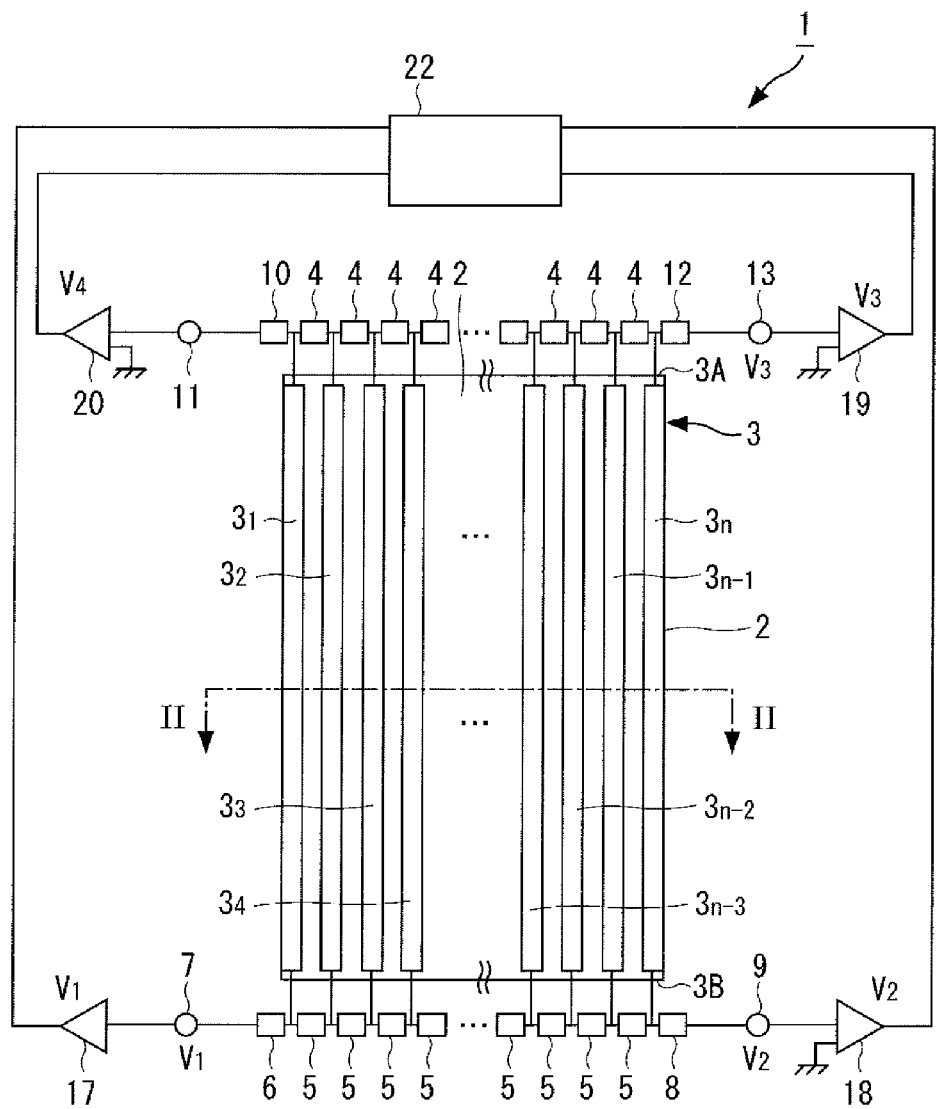
FIG. 1 is a plan view illustrating the composition of a semiconductor 2D position detector related to a first embodiment of the present invention.

1, 30: Semiconductor 2D position detector
2: Semiconductor substrate
2A: Surface of semiconductor substrate
2B: Rear surface of semiconductor substrate
2C: Groove of semiconductor substrate
3: Stripe electrode
4, 5: Resistor
6, 8, 10, 12: Output resistor
7: First terminal for signal output
9: Second terminal for signal output
11: Fourth terminal for signal output
13: Third terminal for signal output
15: Schottky electrode
16: Radiation
17 to 20: Signal detector
22: Operation part
25: Radiation irradiation position
26: Temporary positional coordinate
33: Stripe electrode
33$_{ij}$: Strip electrode
35: Resistor for connecting strip electrodes

MODES FOR CARRYING OUT THE INVENTION

Hereinafter, embodiments of the present invention will be described in detail with reference to the figures. The like reference characters are used to designate like or corresponding components in each figure.

First Embodiment

Figure 2:
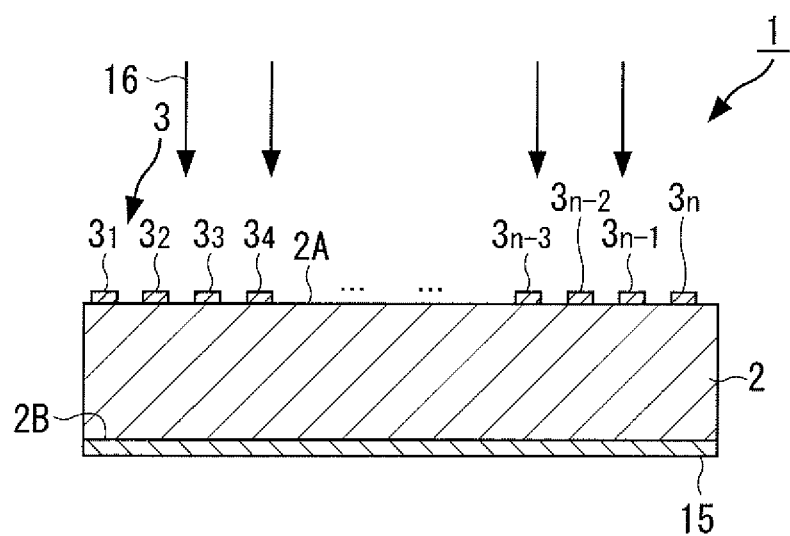
FIG. 2 is a cross-sectional view taken along the line II-II in FIG. 1.

FIG. 1 is a plan view illustrating the composition of a semiconductor 2D position detector for two-dimensionally detecting the positions of radiation related to a first embodiment of the present invention. FIG. 2 is a cross-sectional view taken along the line II-II in FIG. 1.

This semiconductor 2D position detector 1 comprises a semiconductor substrate 2, a first to an nth (n is an integer of 2 or higher) stripe electrodes 3 arranged on the surface 2A of the semiconductor substrate 2 at given intervals in the X direction and in parallel to the Y direction, a plurality of resistors 4 connecting the top ends 3A of the first to the nth stripe electrodes 3 adjacent to each other, a plurality of resistors 5 connecting the bottom ends 3B of the first to the nth stripe electrodes 3 adjacent to each other, a first terminal 7 for signal output connected to the bottom end 3B of the first stripe electrode 3$_1$ via a output resistor 6, a second terminal 9 for signal output connected to the bottom end 3B of the nth stripe electrode 3*n* via a output resistor 8, a fourth terminal 11 for signal output connected to the top end 3A of the first stripe electrode 3$_1$ via a output resistor 10, a third terminal 13 for signal output connected to the top end 3A of the nth stripe electrode 3$_n$ via a output resistor 12, and an electrode 15 disposed on the rear surface 2B of the semiconductor substrate 2. Note that the stripe electrode 3 in the first row is designated as 3$_1$, for example.

In this case, the semiconductor 2D position detector 1 is a Schottky diode comprising: the first to the nth stripe electrodes 3 disposed on the surface 2A of the semiconductor substrate 2; and the electrodes 15 disposed on the rear surface 2B.

The semiconductor 2D position detector 1 in the first embodiment is biased in the reverse direction. A depletion layer has been formed within the semiconductor substrate 2 in that state, and the output signals from the radiation 16 entering the semiconductor substrate 2 can be obtained from the first to the fourth terminals 7, 9, 11, 13 for signal output. The output from the terminals 7, 9, 11, 13 for signal output is a voltage or a current.

In the semiconductor 2D position detector 1, n pieces, 8 pieces for example, of stripe electrodes 3, which is made of indium, etc., has a certain width in the X direction, and extending in the Y direction, are disposed on the surface 2A of the semiconductor substrate 2 made of a CdTe crystal, for example, at given intervals in parallel to each other. The electrode 15 on the rear surface 2B of the semiconductor substrate 2 can be an electrode made of platinum (Pt), for example.

In this case, Schottky type electrodes having high electrically conductive resistivity can be used as the stripe electrodes. Also, as the electrode disposed on the rear surface of the semiconductor substrate, one having high electrical conductivity can be used.

Figure 3:
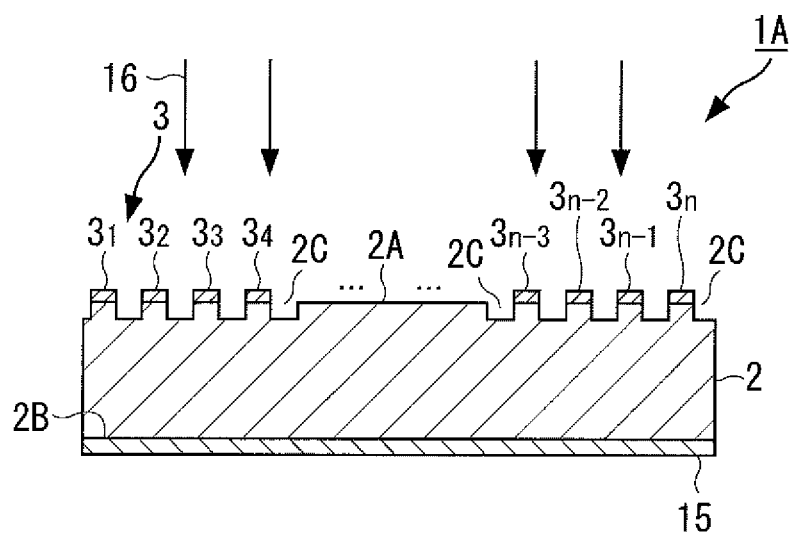
FIG. 3 is a cross-sectional view illustrating another composition of the semiconductor 2D position detector.

FIG. 3 is a cross-sectional view illustrating another composition of the semiconductor 2D position detector 1. The semiconductor 2D position detector 1A shown in FIG. 3 is the same as the semiconductor 2D position detector 1 shown in FIG. 2 except that the stripe electrodes 3 disposed on the surface 2A of the semiconductor substrate 2 are separated from each other with elongated grooves 2C. The stripe electrodes 3 are electrically separated from each other by providing the grooves 2C. The grooves 2C can be fabricated by forming a thin film made of a metallic material by evaporation in vacuum, which will become stripe electrodes 3, on the semiconductor substrate 2, and then performing cutting using a diamond or by photo lithography and etching. The metallic material used for the stripe electrodes 3 is indium, for example.

For an example, a stripe electrode 3 is an indium-evaporated film having the length in the Y direction of 20 mm, width in the X direction of 1.1 mm, and thickness of 500 Å. The resistance value between the both ends of the stripe electrode 3 is 1 MΩ, for example. The pitch between adjacent stripe electrodes 3, namely the distance between the centerlines of the adjacent stripe electrodes 3, is 1.2 mm, for example. In this case, the gap between the adjacent stripe electrodes 3, or the width of the grooves 2C described above, is approximately 0.1 mm.

A signal amplifier (not shown) may be installed to adjust output signals between signal detectors 17 to 20 and the first to the fourth terminals 7, 9, 11, 13 for signal output. As the signal detectors 17 to 20, charge-sensitive amplifiers can be used. The following description assumes that the signal detectors 17 to 20 are charge-sensitive amplifiers.

The adjacent stripe electrodes 3 are all electrically connected via a resistor 4 at the top end 3A of the stripe electrodes 3. Similarly, at the bottom 3B of the stripe electrodes, the adjacent stripe electrodes are all electrically connected via a resistor 5. The resistance value of the resistors 4, 5 is 20 kΩ, for example. The resistors 4, 5 are inserted to distinguish the output of each stripe electrode 3. As the resistors 4, 5, external resistors to be connected to the stripe electrodes 3, or those formed on the semiconductor substrate 2, can be used. Furthermore, the resistance value of the resistors 4, 5 may be made adjustable. When the resistors 4, 5 are formed with metallic thin film, the resistance value can be adjusted by laser trimming, etc.

The first to the fourth terminals 7, 9, 11, 13 for signal output are connected to the first to the fourth signal detectors 17 to 20, and output signals $V_1$ to $V_4$ are output from the first to the fourth signal detectors 17 to 20. The output signals $V_1$ to $V_4$ are input to an operation part 22. The operation part 22 is equipped with an A/D converter, interface circuit (I/O), and computers such as RISC.

(Current Path in the Semiconductor 2D Position Detector 1)

Hereinafter, the current path of the semiconductor 2D position detector 1 related to the first embodiment shown above will be described.

Figure 12:
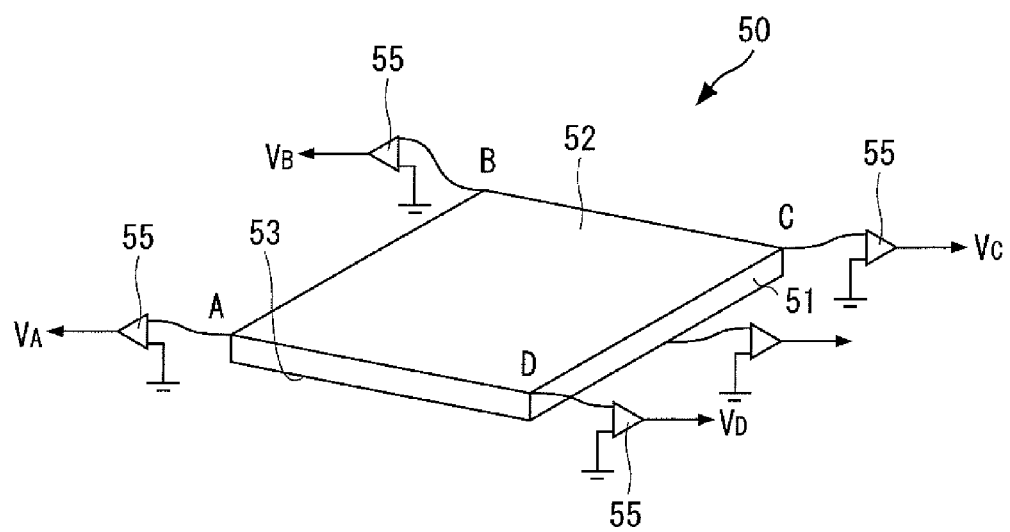
FIG. 12 illustrates a conventional semiconductor 2D position detector disclosed in patent reference 2.
Figure 13:
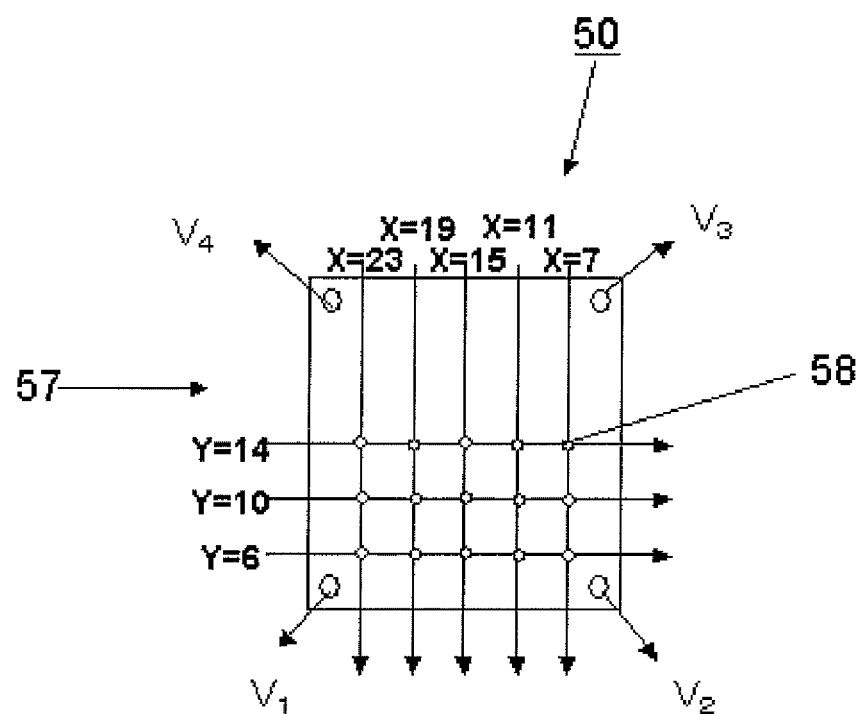
FIG. 13 illustrates radiation irradiation positions of a conventional semiconductor 2D position detector.
Figure 14:
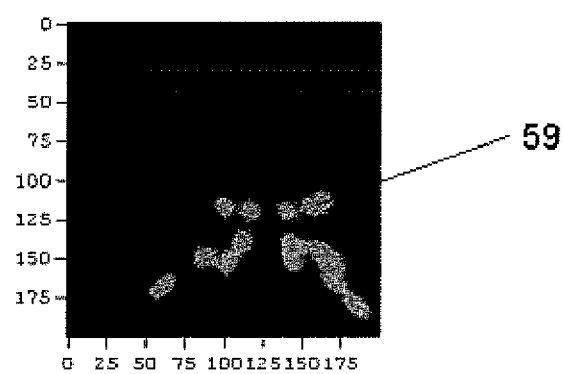
FIG. 14 illustrates the result of position detection by a conventional semiconductor 2D position detector.

A current, which is generated by the radiation 16 irradiated to the semiconductor 2D position detector 1 and collided with the stripe electrodes 3, flows toward the both ends of the stripe electrodes 3. In the case of the conventional planar electrode as shown in FIG. 12, current flows in two-dimensional directions, whereas in the case of the semiconductor 2D position detector 1, current flows in one-dimensional directions. More specifically, in the case of a planar electrode, current flows in multiple directions from the position of the collision of the radiation 16. However, in the case of the semiconductor 2D position detector 1, current flows in the Y direction, namely the direction of the extension of the stripe electrodes 3, because each stripe electrode 3 is separated from each other to block the flow in the X direction.

The current branches from the both ends of the stripe electrodes 3, and flows via the resistors 4, 5 and output resistors 6, 8, 10, and 12 toward the first to the fourth signal detectors 17 to 20. Assuming that the resistance of the stripe electrodes 3 is 1 MΩ, this is sufficiently higher than 20 kΩ, which is the resistance value of the resistors 4, 5. The current, which flows into another stripe electrode, is significantly smaller than the current flowing into the first to the fourth signal detectors 17 to 20.

Since the distance from the incident position of the radiation 16 to the both ends of the stripe electrodes 3 is in proportion to the resistance value in the Y direction, the incident position of the radiation 16 in the Y direction can be calculated from the voltage ratio detected by the first and the fourth signal detectors 17, 20, for example. To calculate the incident position of the radiation 16 in the Y direction, the second and the third signal detectors 18, 19 can also be used.

Hereinafter, the charge-sensitive amplifiers used as signal detectors 17 to 20 will be described.

The distance from the incident position of the radiation 16 to the both ends of the stripe electrodes 3 is in proportion to the resistance value in the Y direction, whereas the current flowing through resistors is in reverse proportion. Since the current value is in proportion to induced charge, the output of charge-sensitive amplifiers increases in proportion to the current value. Consequently, the incident position of the radiation 16 in the Y direction can be calculated from the signals detected by the first, second, third, and fourth charge-sensitive amplifiers 17 to 20.

The distance from the stripe electrode 3, to which the radiation 16 is applied, to the both ends in the X direction is in proportion to the resistance value in the X direction. Since the stripe electrodes 3 are sequentially connected via the resistors 4, 5, the longer the distance in the X direction, the higher the number of resistors 4, 5 placed in between, hence higher the resistance value. Consequently, the incident position of the radiation 16 in the X direction can be calculated from the ratio of voltages detected by the first and the second signal detectors 17, 18 placed on both sides in the X direction, for example. To calculate the incident position of the radiation 16 in the X direction, the second and the third signal detectors 18, 19 can also be used. In the X direction, the incident position of the radiation 16 in the Y direction can be calculated from the signals detected by the first, second, third and fourth charge-sensitive amplifiers 17 to 20. Since resistors 4, 5 are placed between the adjacent stripe electrodes 3, the information for identifying from which stripe electrode 3 current is generated can be obtained. For the convenience of calculation, it is desirable that the resistance value of each resistor 4, 5 be equal.

The current is generated when the radiation 16 enters the stripe electrodes 3. When the radiation 16 enters grooves 2C, the current is divided into the stripe electrodes 3 placed on both sides of grooves. Consequently, it is desirable that the width of the grooves 2C be as narrow as possible to detect the radiation 16.

When the radiation 16 enters the stripe electrodes 3, the narrower the stripe electrodes 3, the higher the position resolution in the X direction. However, the narrower the width of the stripe electrodes 3, the greater the ratio of the width of the grooves 2C to that of the electrodes. Hence higher the ratio of the area of the grooves 2C to the total substrate area, and consequently, the detection accuracy decreases.

The smaller the resistance value of the resistors 4, 5, the smaller the distortion of the central region of the temporary positional coordinates $(X_i, Y_j)$ in the Y direction. However, when the resistance value of the resistors 4, 5 is made to be too small, the signal detectors placed on the same side of the stripe electrode 3 are made to be in a state of mostly directly coupled. In this case, it is difficult to distinguish the current generated as a result of entry of the radiation 16 from other noise current. The signal detectors on the same side are, for example, the first signal detector 17 and the second signal detector 18, or the fourth signal detector 19 and the third signal detector 20. Charge-sensitive amplifiers can be used as the first to the fourth signal detectors 17 to 20.

Meanwhile, the larger the resistance value of the resistors 4, 5, the higher the discrimination for identifying the stripe electrode 3 which generates the current. However, when the difference in resistance value between the resistors 4, 5 and the stripe electrodes 3 is made to be too small, the current leaks to other stripe electrodes, thus increasing the distortion in the central region in the Y direction on the temporary positional coordinates $(X_i, Y_j)$.

In light of the above situations, it is preferable to keep the resistance ratio of the stripe electrodes 3 and the resistors 4, 5 within the 10:1 to 100:1 range to suppress the distortion in the Y direction on the temporary positional coordinates $(X_i, Y_j)$ while maintaining the discrimination between the current to be detected and noise current. In the measurement example to be described later, the resistance value of the stripe electrodes 3 was 1 MΩ, and the favorable resistance value of the resistors 4, 5 fell within the range of 10 kΩ to 40 kΩ.

(Method 1 of Calculating the Incident Positions of Radiation 16)

Hereinafter, the method of calculating the incident positions of radiation 16 in the semiconductor 2D position detector 1 related to the first embodiment will be described.

The output signals $V_1$ to $V_4$ from the first to the fourth signal detectors 17 to 20 are processed arithmetically by the operation part 22, and the incident position of the radiation 16 is calculated. Specifically, the temporary positional coordinates $(X_i, Y_j)$ are calculated using the formulae (1) and (2) shown below based on the output signals $V_1$ to $V_4$.

[Formula 1]
$$X_i = \frac{(V_2 + V_3) - (V_1 + V_4)}{V_1 + V_2 + V_3 + V_4} \quad (1)$$

[Formula 2]
$$Y_j = \frac{(V_4 + V_3) - (V_1 + V_2)}{V_1 + V_2 + V_3 + V_4} \quad (2)$$

(Example 1 of Detecting the Incident Positions of Radiation 16)

Hereinafter, example 1 of detecting the radiation 16 using semiconductor 2D detector 1 will be described.

Figure 4:
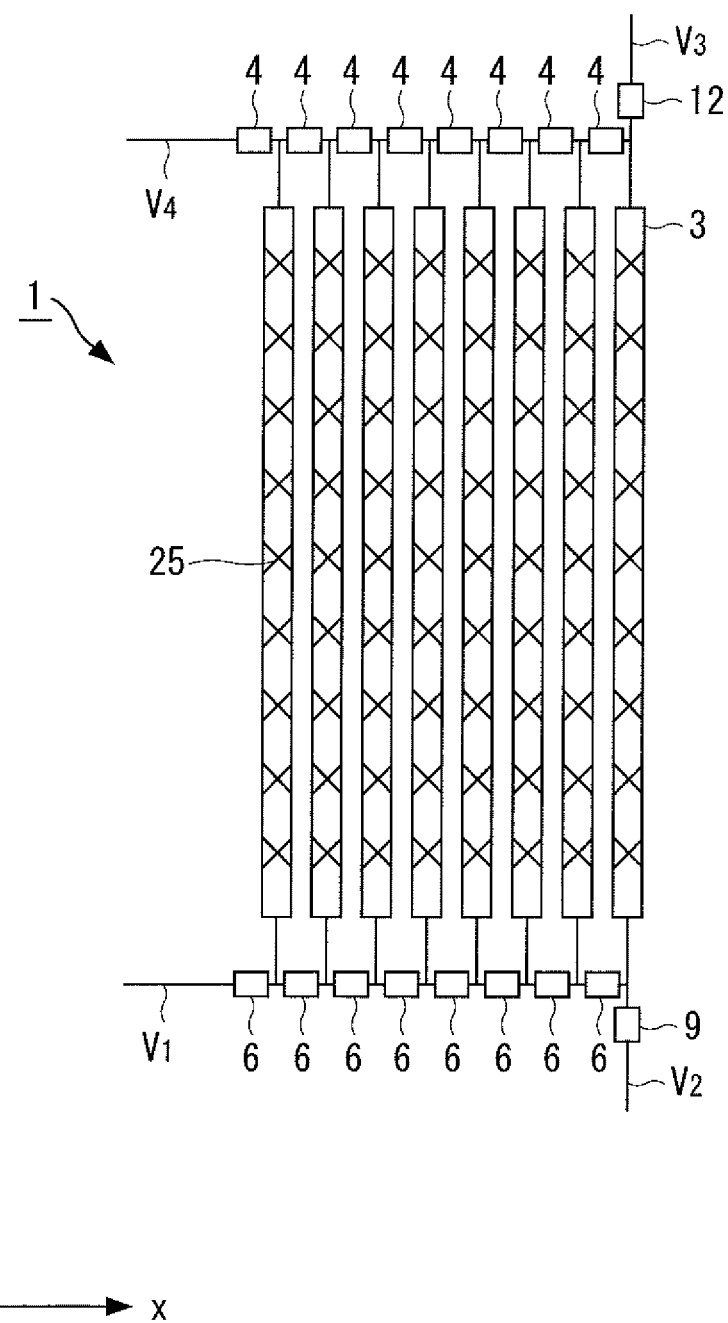
FIG. 4 is a plan view illustrating irradiation positions of radiation on the semiconductor 2D position detector.

FIG. 4 is a plan view illustrating the irradiation positions of the radiation 16 to the semiconductor 2D position detector 1. The semiconductor 2D position detector 1 as shown in FIG. 4 has a semiconductor substrate 2 made of CdTe, and 8 rows of stripe electrodes 3. A stripe electrode 3 is an indium-deposited film having the length in the Y direction of 20 mm, the width in the X direction of 1.1 mm, and the thickness of 500 Å. The resistance value between both ends of the stripe electrode 3 is 1 MΩ. The pitch between the adjacent stripe electrodes 3 (distance between the center lines of the adjacent electrodes 3) is 1.2 mm. In this case, the width of the groove 2C stretching between the adjacent stripe electrodes 3 is approximately 0.1 mm. The electrode 15 on the rear surface 2B of the semiconductor substrate 2 was made of platinum. The positions marked with X in the figure represent the irradiation positions 25 of the radiation 16. As the radiation 16, an alpha ray was applied using a [241]Am source.

Figure 5:
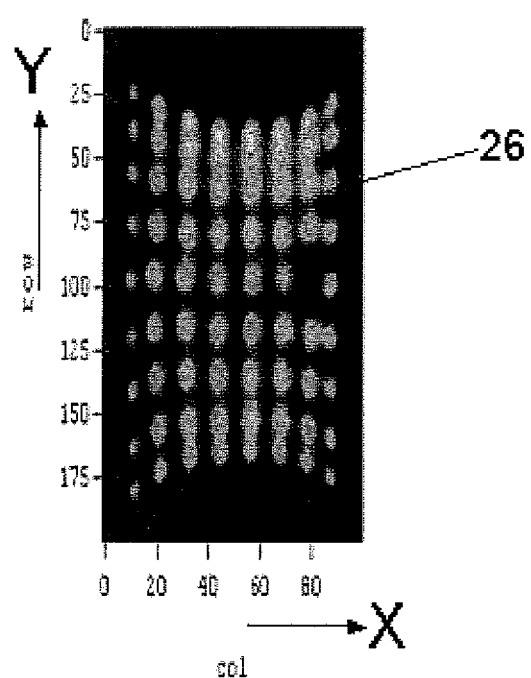
FIG. 5 illustrates temporary positional coordinates obtained using the semiconductor 2D position detector for the irradiation positions of radiation as shown in FIG. 4.

FIG. 5 illustrates temporary positional coordinates 26 corresponding to the irradiation positions 25 of the radiation 16 shown in FIG. 4 obtained using the semiconductor 2D position detector 1. The horizontal and the vertical axes in the figure correspond to those of the plan view in FIG. 4.

As is apparent from FIG. 5, the temporary positional coordinates 26 of the radiation 16 are separated from one another in the X and Y directions in a distinguishable state. The resolution on the two-dimensional surface was found to be much higher than that of the conventional semiconductor 2D detector 50 as shown in FIG. 12. Especially, the temporary positional coordinates in the X direction are placed at mostly equal intervals. However, since those in the Y direction are distorted at the central region, this indicates that the actual irradiation positions 25 of the radiation 16 were not reproduced thoroughly.

(Method 2 of Calculating the Incident Positions of the Radiation 16)

So, further computation is performed based on the temporary positional coordinates $(X_i, Y_j)$ to derive detected positional coordinates $(X_p, Y_q)$.

Hereinafter, the procedure of determining the correction function for deriving detected positional coordinates $(X_p, Y_q)$ will be described.

Figure 6:
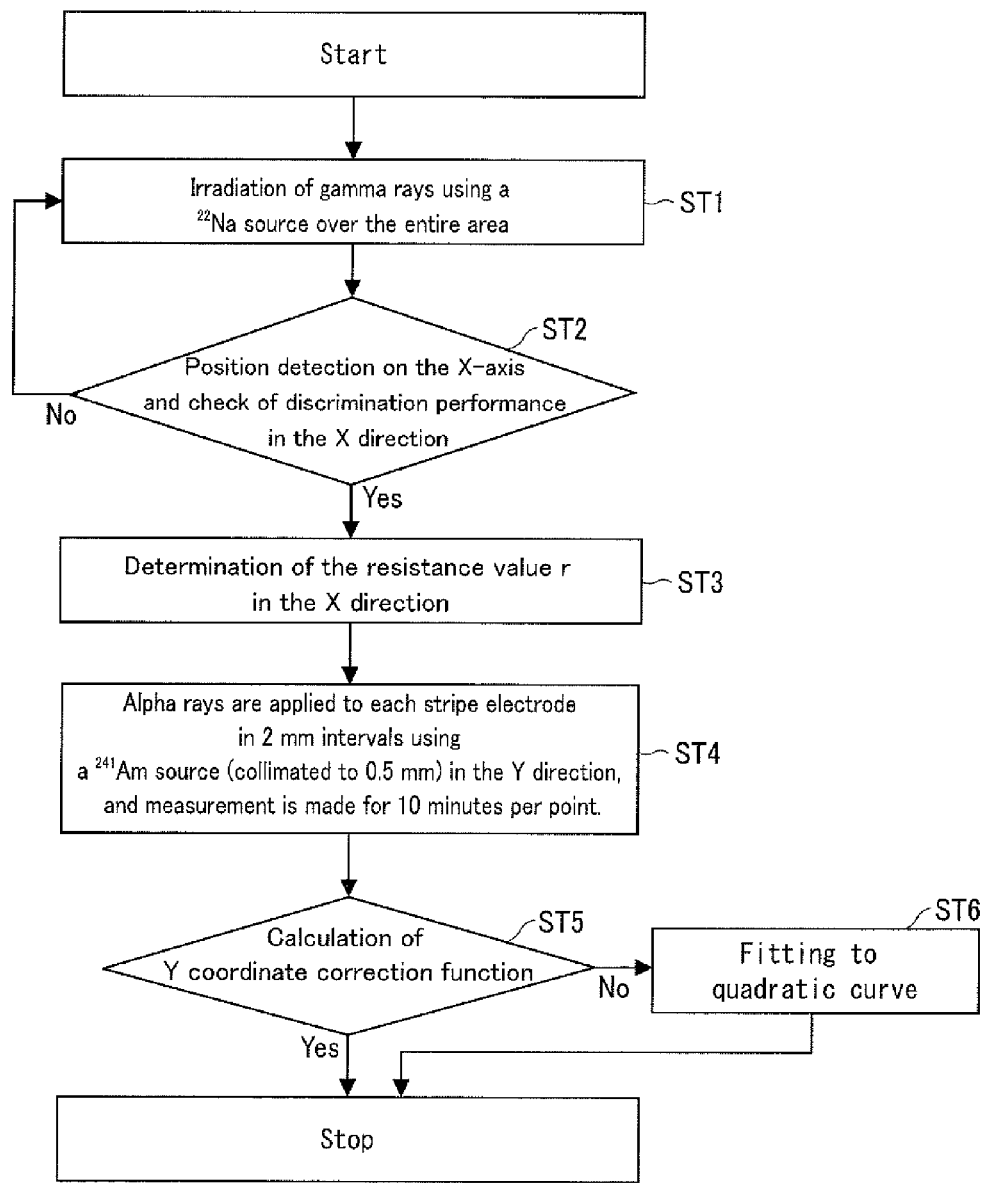
FIG. 6 is a flow chart illustrating the process of calculating detected positional coordinates ($X_p$, $Y_q$)

FIG. 6 is a flow chart illustrating the process of calculating the detected positional coordinates $(X_p, Y_q)$. As shown in FIG. 6, in step ST1, a gamma ray is applied to the whole area using a [22]Na radiation source, etc. to examine the accuracy of detected positions of the semiconductor 2D position detector 1.

In step ST2, the distribution of computed value is measured, the discrimination performance in the X direction is checked, and the values of the above resistors 4, 5 are adjusted. When the positions on the X-axis and the discrimination performance in the X direction are checked successfully, proceed to step ST3. Meanwhile, the positional detection on the X-axis and the discrimination performance in the X direction are found to be insufficient, return to step ST1.

Next, in step ST3, the resistance value r in the X direction is determined.

In step ST4, alpha ray, etc. are applied using a [241]Am radiation source (collimated to 0.5 mm). The alpha ray is applied to each stripe electrode 3 at the center in the X direction and at 2 mm intervals in the Y direction, namely irradiation positions 25 marked with X in FIG. 4, to calculate temporary positional coordinates 26. Irradiation and calculation were repeated at each irradiation position 4, and measurement was taken at each point for 10 minutes.

In step ST5, detected positional coordinates in the Y direction were calculated as in the case of those in the X direction, and secondary curve fitting, which will be described later, was performed as required in step ST6, to complete the measurement. As a result, temporary coordinates 26 of the radiation 16 as shown in FIG. 5 were obtained.

Next, the followings are confirmed by the obtained temporary positional coordinates $(X_i, Y_j)$:

(1) The temporary positional coordinates lined up in the X direction are distributed at equally-spaced intervals in the X direction.

(2) The position of $Y_j$ on the temporary positional coordinates $(X_i, Y_j)$ lined up in the X direction is distorted in the Y direction.

From the above, it is assumed that the temporary positional coordinates are on a quadratic curve defined as $Y_j = aX_i^2 + bX_i + c$. The optimum coefficients a, b and c can be determined and the above quadratic curve can be defined by performing fitting based on the coordinates $(X_i, Y_j)$ lined up in the X direction, assuming that they are on the quadratic curve.

In the above example, fitting was performed based on temporary positional coordinates $(X_1, Y_1)$ to $(X_8, Y_1)$, and a, b and c were found to be 0.4638, −0.0312, and 0.2982 respectively.

Next, the detected positional coordinates $(X_p, Y_q)$ of the radiation 16 are then calculated based on the temporary positional coordinates $(X_i, Y_j)$ using the relational formulae (3) to (5) shown below.

Note that d is a normalization constant, and d=0.38 in the following case.

[Formula 3]
$$X_p = f(X_i, Y_j) \quad (3)$$

[Formula 4]
$$Y_q = g(X_i, Y_j) \quad (4)$$

[Formula 5]
$$Y_q = g(X_i, Y_j) = d * \frac{Y_j}{aX_i^2 + bX_i + c} \quad (5)$$

With the above formula (5), assuming that $X_p$ is $X_i$, $Y_q$ can be calculated by dividing $Y_j$ by the quadratic function of $X_i$. The following formula (6) can also be used instead of formula (5). In formula (6), assuming that $X_p$ is $X_i$, $Y_q$ can be calculated by multiplying $Y_j$ by the quadratic function of $X_i$.

[Formula 6]
$$Y_q = g(X_i, Y_j) = \frac{Y_j}{d'}(a'X_i^2 + b'X_i + c') \quad (6)$$

where, a', b' and c' of the quadratic function are arbitrary constants, and d' is a normalization constant.

The left and right asymmetry of the temporary positional coordinates $(X_i, Y_j)$ lined up in the X direction results from the coefficient b of the linear term of $X_i$. When the temporary positional coordinates lined up in the X direction is laterally symmetrical, b=0, which facilitates subsequent processes. When the temporary positional coordinates lined up in the X direction is laterally asymmetrical, the temporary positional coordinates line up in the X direction can be adjusted by adjusting the value of output signals $V_1$ to $V_4$ with the first to the fourth signal detectors 17 to 20. Further, the value of the output signals $V_1$ to $V_4$ can also be adjusted by changing the amplification factor of a signal amplifier (not shown).

The left and right asymmetry of the temporary positional coordinates $(X_i, Y_j)$ lined up in the X direction results from the coefficient b of the linear term of $X_i$. When the temporary positional coordinates lined up in the X direction is laterally symmetrical, b=0, which facilitates subsequent processes. When the temporary positional coordinates lined up in the X direction is laterally asymmetrical, the temporary positional coordinates line up in the X direction can be adjusted by adjusting the value of output signals $V_1$ to $V_4$ with the first to the fourth signal detectors 17 to 20. The value of the output signals $V_1$ to $V_4$ can also be adjusted by changing the amplification factor of a signal amplifier (not shown).

(Detected Positional Coordinate Obtained by Calculation Method 2 for Calculating the Incident Positions of Radiation 16)

Figure 7:
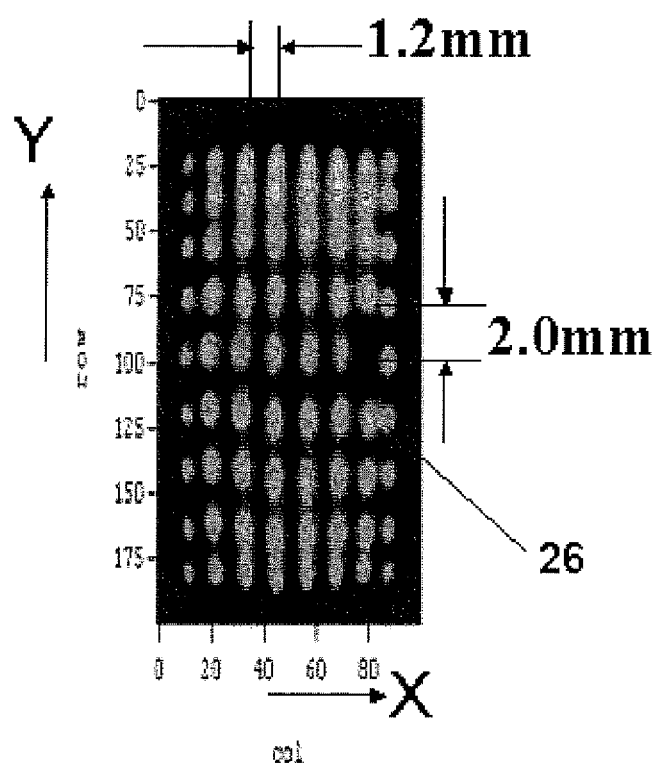
FIG. 7 illustrates the detected positional coordinates ($X_p$, $Y_q$) obtained from temporary positional coordinates ($X_i$, $Y_j$) using formulae (3) and (4)

FIG. 7 illustrates the detected positional coordinates $(X_p, Y_q)$ obtained from temporary positional coordinates $(X_i, Y_j)$ using formulae (3) and (4). It is apparent that the measurement points correspond to the irradiation positions marked with X in FIG. 4.

As shown in FIG. 7, the intervals in the X direction on the detected positional coordinates $(X_p, Y_q)$ are 1.2 mm, and those in the Y direction are 2 mm, which indicates that position resolution in the Y direction of 1 mm has been obtained.

As shown in FIG. 7 compared to the result of the temporary positional coordinates 26 of the radiation 16 as shown in FIG. 5, the detected positional coordinates $(X_p, Y_q)$, which are obtained by correction using formulae (3) and (4), correspond to the actual detected positions of the radiation 16. It is apparent that high detection results having the high position accuracy were obtained. Note that $X_p$ is equal to $X_i$. A significant feature of this method is that as shown in formulae (5) and (6), $Y_q$ can be obtained by multiplying or dividing $Y_j$ by $X_i$.

In the above correction example, the fitting is performed by assuming that the temporary positional coordinates $Y_j$ are on the quadratic curve of $X_i$. However, a correction function can be selected as required. For example, as functions distorting at the center, a quartic function or a sixtic function can also be used.

The left and right asymmetry of the temporary positional coordinates $(X_i, Y_j)$ lined up in the X direction results from the coefficient b of the linear term of $X_i$. When the temporary positional coordinates lined up in the X direction is laterally symmetrical, b=0, which facilitates subsequent processes. When the temporary positional coordinates lined up in the X direction is laterally asymmetrical, the temporary positional coordinates lined up in the X direction can be adjusted by adjusting the value of output signals $V_1$ to $V_4$ with the first to the fourth signal detectors 17 to 20. The value of the output signals $V_1$ to $V_4$ can also be adjusted by changing the amplification factor of a signal amplifier (not shown).

Correction is made using the quadratic function of $X_i$ in the examples shown above. However, various correction functions can be used, in addition to the one used this time.

In the above correction example, the correction function obtained by performing fitting based on the temporary positional coordinates at Y=1 is applied to all the temporary positional coordinates 26 to calculate the detected positional coordinates. However, it is also possible to apply a correction function obtained based on the temporary positional coordinates at the same $Y_j$ position to each temporary positional coordinate.

Figure 8:
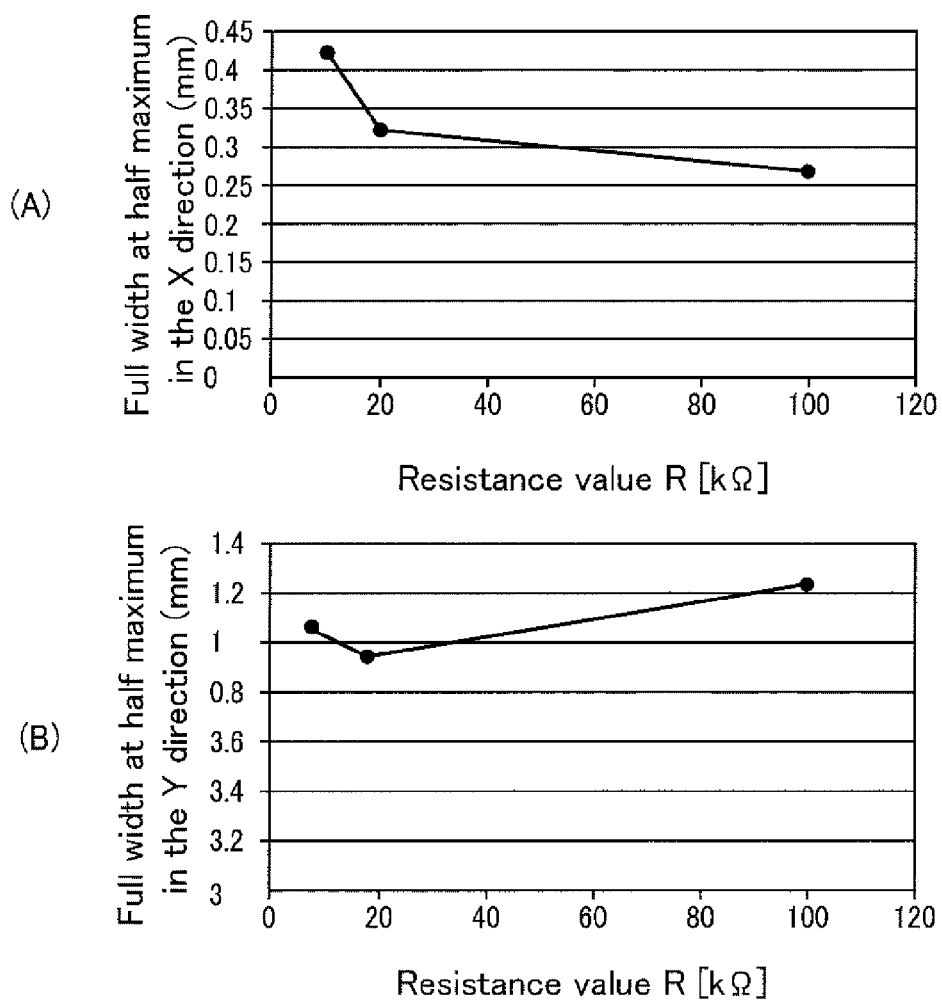
FIG. 8 is a chart displaying the dependency of resolution in the X and Y directions on the resistance value of resistors 4, 5, in which (A) represents the full width at half maximum (FWMH) in the X direction, and (B) represents the full width at half maximum (FWMH) in the Y direction, respectively.

FIG. 8 is a chart displaying the dependency of the resistance value of resistors 4, 5, with respect to the resolution in the X and Y directions, in which (A) represents the full width at half maximum (FWMH) in the X direction, and (B) represents the full width at half maximum (FWMH) in the Y direction, respectively. The horizontal axis in FIG. 8 represents resistance value (kΩ), and the vertical axis in FIG. 8 represents the full width at half maximum (mm).

As shown in FIG. 8 (A), the full width at half maximum in the X direction is approximately 0.3 mm or higher when the resistance value of the resistors 4, 5 is 20 kΩ or lower. Meanwhile, when the resistance value of the resistors 4, 5 falls within the 20 kΩ to 100 kΩ range, the full width at half maximum decreases, falling within approximately 0.3 mm to 0.25 mm range. From the above, it was found that when the resistance value of the resistors 4, 5 is 20 kΩ or lower, the full width at half maximum in the X direction increases, meaning that the spatial resolution of the semiconductor 2D position detector 1 degrades. The resistance value of the stripe electrodes 3 is 1 MΩ as stated previously. In this case, the ratio of the resistance value of the stripe electrodes (1 MΩ) to the resistance value of the resistors 4, 5 (20 kΩ) connected to the top ends of the stripe electrodes 3 is 50:1, meaning that the spatial resolution does not degrade.

As is apparent from FIG. 8 (B), the full width at half maximum in the Y direction, namely the resolution, remains minimum when the resistance value of the resistors 4, 5 is 20 kΩ. With the increase of the resistance value of the resistors 4, 5, the full width at half maximum also increases. In this case also, the ratio of the resistance value (1 MΩ) of the stripe electrodes to the resistance value (20 kΩ) of the resistors 4, 5 connecting the adjacent top ends of the stripe electrodes 3 is 50:1, meaning that the spatial resolution does not degrade.

It is necessary to choose the thickness of indium fall within the 150 Å to 600 Å range to fabricate stripe electrodes 3 by indium vapor evaporation to have electrically conductive resistivity and to make the semiconductor 2D position detector 1 operated as a Schottky type radiation detector. When the thickness of indium is kept within this range, the resistance value of the stripe electrodes 3 falls within the 1 MΩ to 4 MΩ range. Consequently, to prevent the spatial resolution of the semiconductor 2D position detector 1 from degrading, it is ideal to select the resistance value of the resistors 4, 5, allowing the ratio of the resistance value of the resistors 4, 5 to that of the stripe electrodes 3 is set to be 1/10 to 1/100.

The measurement examples and correction examples described above assumes alpha rays as an irradiation source. Needless to say, the present invention can be applied to other radiation sources such as gamma rays.

Second Embodiment

Hereinafter, the semiconductor 2D position detector related to the second embodiment of the present invention will be described.

Figure 9:
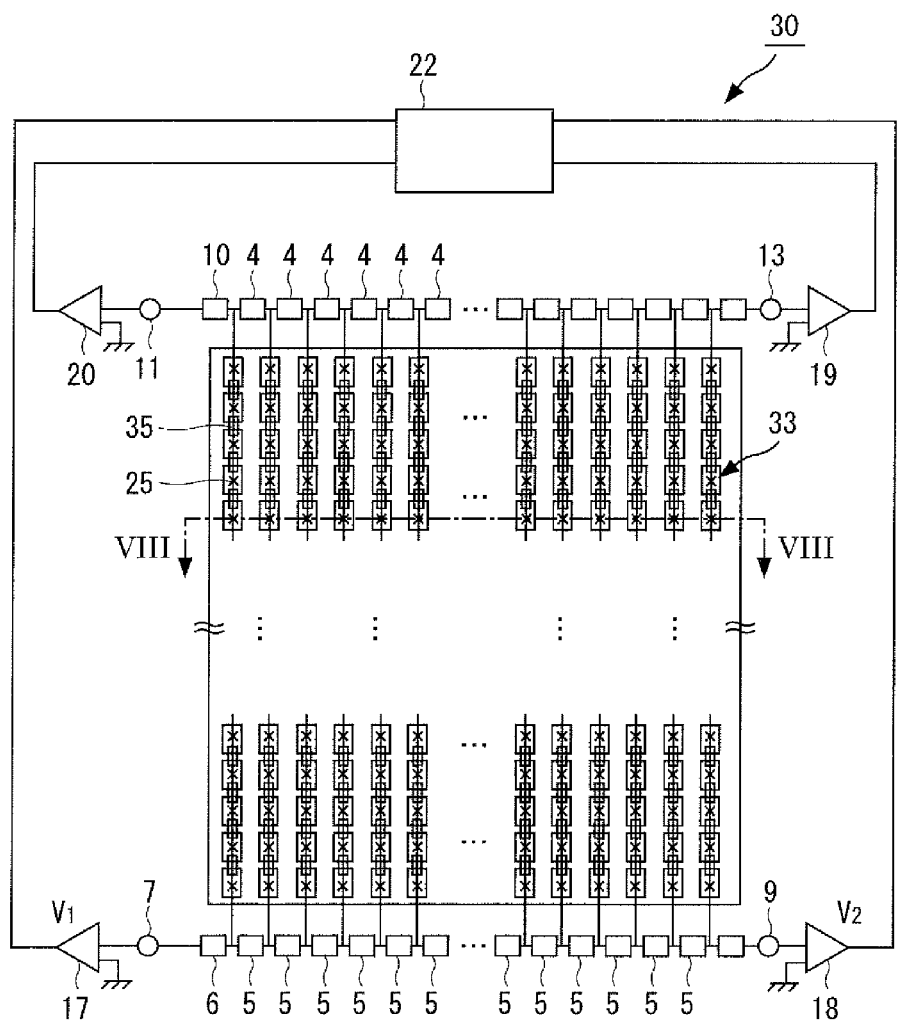
FIG. 9 is a plan view illustrating the composition of a semiconductor 2D position detector related to the second embodiment of the present invention.
Figure 10:
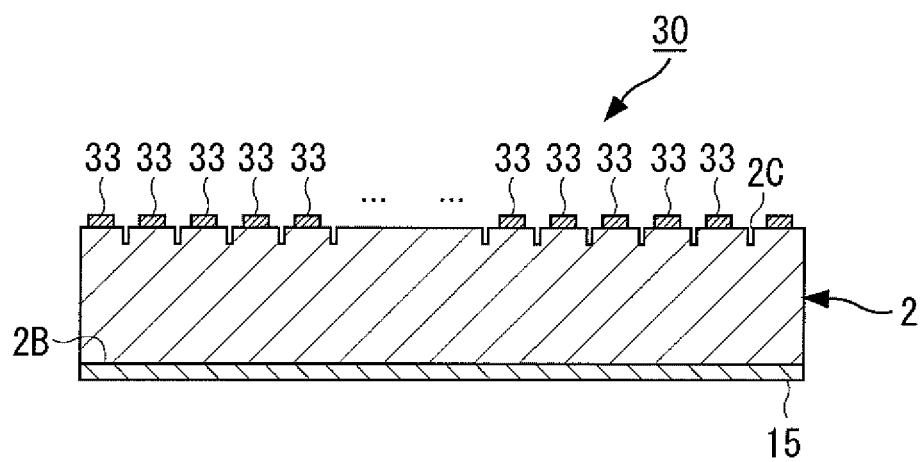
FIG. 10 is a cross-sectional view taken along the line VIII-VIII in FIG. 9.

FIG. 9 is a plan view illustrating the composition of a semiconductor 2D position detector 30 related to the second embodiment of the present invention. FIG. 10 is a cross-sectional view taken along the line VIII-VIII in FIG. 9.

The semiconductor 2D position detector 30 is the same as the first embodiment of the semiconductor 2D position detector 1A as shown in FIG. 3 except for the structure of the stripe electrode 33 in each row. Specifically, a plurality of strip electrodes $33_{ij}$ separated by grooves 2C formed in the Y direction and groves 2D formed in the X direction, which will be described later, are connected only in the Y direction via resistors 35 to form the stripe electrodes 33. Since other structures are the same as the semiconductor 2D position detectors 1, 1A in the first embodiment, the description will be omitted.

The strip electrode 33 is comprised of a plurality of strip electrodes $33_{ij}$ arranged in a matrix of m lines×n columns. In this case, the line i consists of natural numbers from 2 up to m, and the column j consists of natural numbers from 2 up to n. Since the resistors 35 for connecting the strip electrodes $33_{ij}$ are also arranged in a matrix, they are denoted as $33_{ij}$ or $r_{ij}$, respectively.

Figure 11:
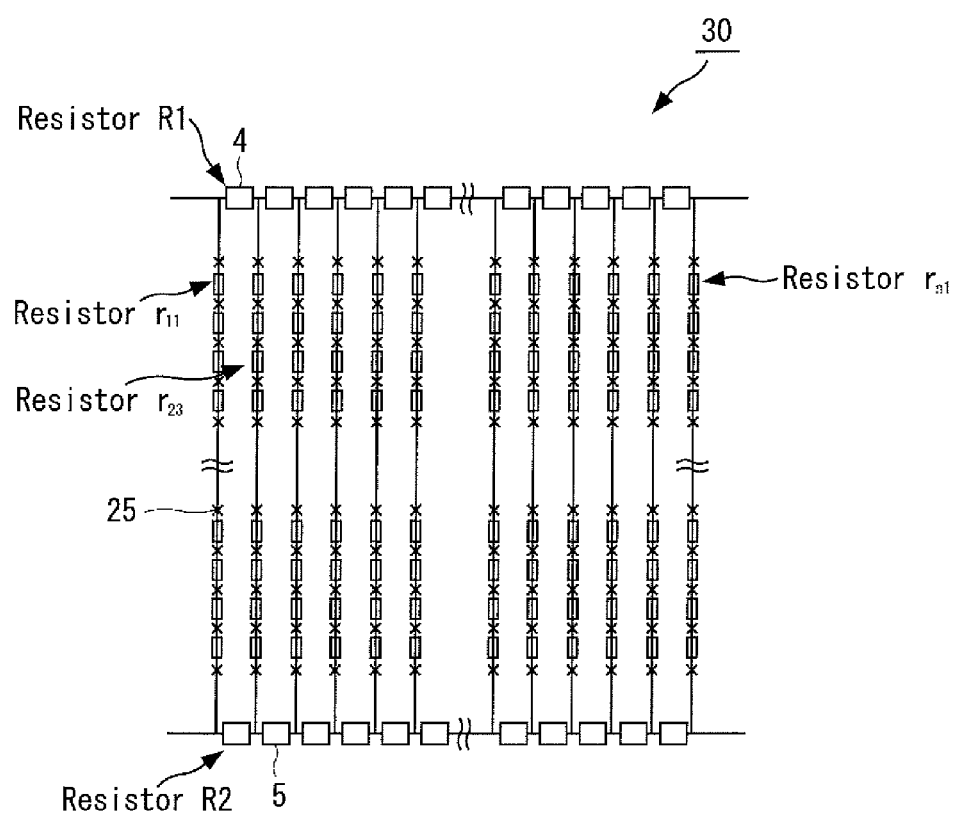
FIG. 11 is an equivalent circuit illustrating the resistor layout of the semiconductor 2D position detector.

FIG. 11 is an equivalent circuit illustrating the resistor layout of the second embodiment of the semiconductor 2D position detector 30. As shown in the figure, the resistor of the resistor $35_{ij}$ on the first line and first column is denoted as $r_{11}$, and the resistance value of the resistors 4, 5 connecting the stripe electrodes 33$j$ lined up in the column direction are denoted as $R_1$, $R_2$. All the $r_{ij}$ should have the same resistance value r, and $R_1$ and $R_2$ should also have the same resistance value R. Furthermore, the resistance value r should be larger than the resistance value R, namely r>R.

In this case, the electrode formed by connecting the strip electrodes $33_{jk}$ (k is a natural number of m or smaller) on the jth column by resistors $r_j$ is called stripe electrode $33_j$. The state in which the strip electrodes $33_j$ on the jth column are connected by resistors $r_j$ is called stripe electrodes $33_j$.

In the case described above, since the resistance value r is larger than the resistance value R in the X direction, the current generated by the radiation 16 does not flow through the stripe electrodes $33_j$ connected by the resistors $r_j$ on other columns. Consequently, the current flowing through V1 and V2 and that flowing through V3 and V4 are divided by the division ratio of the resistance value connected by the same resistance R. V1+V3 and V2+V4 can thus be applied to current division approximation at the resistor column connected via resistance value R.

Since the resistance value r is larger than the resistance value R in the Y direction, the current generated by the radiation 16 does not flow through the stripe electrodes $33_j$ connected via resistor $r_j$ on other columns. Consequently, the current generated by the radiation 16 is split by the division ratio of the resistance value r on the same column on which the radiation is detected.

In the semiconductor 2D position detector 30 in the second embodiment, the temporary positional coordinates 26 and the detected positional coordinates of the radiation can be also calculated using the formulae (1) to (6) as shown above.

According to this semiconductor 2D position detector 30, by keeping the strip electrodes $33_{ij}$ in a matrix state and by connecting the stripe electrodes $33_j$ in each column by resistors 35, the position resolution of radiation detection in the X and Y directions can be improved to the level equivalent to that of the semiconductor 2D position detector 1, 1A or higher.

The semiconductor 2D position detectors 1, 30 of the first and the second embodiments have been described, assuming that the strip electrodes $33_{ij}$ are the electrodes having high electric conductivity. However, Schottky electrodes may be used as the stripe electrodes 3 and strip electrodes $33_{ij}$. In this case, the electrode 15 to be formed on the rear surface 2B of the semiconductor substrate 2 must have high electric conductivity.

In the above description, the temporary positional coordinates 26 of the radiation in the Y direction are corrected by calculation. The semiconductor 2D position detector 30 may be manufactured with the resistance value r varied to minimize the distortion in the Y direction in the manufacturing process, taking the subsequent distortion of the temporary positional coordinates 26 in the Y direction into consideration during the design process.

Hereinafter, a three-dimensional position detector for radiation 16 using a semiconductor 2D position detector will be described.

The surfaces of platinum electrodes 15 of the semiconductor substrate 2 made of CdTe crystal are attached using an electrically conductive paste. By attaching the electrodes and extremely thin insulating films alternately in layers, a semiconductor detector block capable of three-dimensionally measuring the position of gamma rays can be fabricated.

The gamma ray, where semiconductor substrate 2 of the semiconductor detector bock has been measured, is determined by the simultaneous counting of the platinum electrode 15 and the stripe electrodes 3 made of indium. The method of detecting 2D positions of the radiation 16 according to the present invention can also be applied to the semiconductor detector block capable of three-dimensionally measuring gamma ray positions.

The application of the semiconductor detector blocks to a positron emission tomographic apparatus will be described below. Semiconductor detector blocks are laid out in circular or opposed structure in several layers. The semiconductor detector blocks should be of a structure movable in the moving radius or opposing directions. By installing the electrode face of the semiconductor detector blocks, a positron emission tomographic apparatus having the packing ratio of 100% can be achieved.

The embodiments of the present invention are not limited to those described above. Needless to say, various modifications are allowed within the scope of the invention listed in the claims, and they are all included in the scope of the present invention. The width and the length of the stripe electrodes 3, resistors 4, 5 connected to the stripe electrodes 3, resistors 6, 8, 10, 12 connected to the first to the fourth terminals 7, 9, 11, 13 for signal output, etc. can be designed as required depending on the intended accuracy of position detection of radiation 16.

What is claimed is:

1. A semiconductor 2D position detector for two-dimensionally detecting the position of radiation, characterized in that it comprises:
    a semiconductor substrate;
    a first to an nth (n is an integer of 2 or higher) stripe electrodes arranged on the surface of the semiconductor substrate in the X direction at given intervals and in parallel to the Y direction;
    a plurality of resistors connecting the top ends of the first to the nth stripe electrodes adjacent to each other;
    a plurality of resistors connecting the bottom ends of the first to the nth stripe electrodes adjacent to each other;
    a first terminal for signal output connected to the bottom end of the first stripe electrode via a resistor;
    a second terminal for signal output connected to the bottom end of the nth stripe electrode via a resistor;
    a third terminal for signal output connected to the top end of the nth stripe electrode via a resistor;
    a fourth terminal for signal output connected to the top end of the first stripe electrode via a resistor;
    an electrode disposed on the rear surface of the semiconductor substrate; and
    an operation part for calculating the position of radiation using output signals obtained from the first to the fourth terminals for signal output as a result of application of radiation to given points on the semiconductor substrate, wherein
    the first to the nth stripe electrodes are separated from each other along the Y direction by grooves,
    the ratio of the resistance value of each of the stripe electrodes and that of the resistors connecting the top ends and/or bottom ends of the stripe electrodes adjacent to each other falls within the 10:1 to 100:1 range,
    the operation part is calculating the temporary positional coordinates $(X_i, Y_j)$ of the radiation using the formulae (1) and (2) as shown below by obtaining output voltages V1, V2, V3, V4 using the output signals from the first to the fourth terminals for signal output and furthermore calculates the detected positional coordinates $(X_p, Y_q)$ of the radiation using the formulae (3) and (4) as shown below based on the temporary positional coordinates $(X_i, Y_j)$, and
    the resistance ratio is set to the value allowing the distortion of the temporary positional coordinates $(X_i, Y_j)$ in the Y direction to be suppressed and the detected current to be discriminated from noise current:

[Formula 1]

$$X_i = \frac{(V_2 + V_3) - (V_1 + V_4)}{V_1 + V_2 + V_3 + V_4} \qquad (1)$$

[Formula 2]

$$Y_j = \frac{(V_4 + V_3) - (V_1 + V_2)}{V_1 + V_2 + V_3 + V_4} \qquad (2)$$

[Formula 3]

$$X_p = f(X_i, Y_j) \qquad (3)$$

[Formula 4]

$$Y_q = g(X_i, Y_j) \qquad (4)$$

where, the functions $f(X_i, Y_j)$ and $g(X_i, Y_j)$ of the formulae (3) and (4) as shown above are found according to the following procedure: The radiation spots on the stripe electrodes of the semiconductor 2D position detector are irradiated in the Y direction at given intervals, the temporary positional coordinate of each irradiation position is calculated. Then assuming a corrective function for the positional coordinate of each irradiation position and the temporary positional coordinate of each irradiation position after calculating the temporary positional coordinate of each irradiation position, the above functions $f(X_i, Y_j)$ and $g(X_i, Y_j)$ are found by fitting as a function for reproducing the positional coordinate of each radiation irradiation position.

2. A semiconductor 2D position detector for two-dimensionally detecting the position of radiation, characterized in that it comprises:
    a semiconductor substrate;
    a first to an nth (n is an integer of 2 or higher) stripe electrodes arranged on the surface of the semiconductor substrate in the X direction at given intervals and in parallel to the Y direction;
    a plurality of resistors connecting the top ends of the first to the nth stripe electrodes adjacent to each other;
    a plurality of resistors connecting the bottom ends of the first to the nth stripe electrodes adjacent to each other;
    a first terminal for signal output connected to the bottom end of the first stripe electrode via a resistor;
    a second terminal for signal output connected to the bottom end of the nth stripe electrode via a resistor;
    a third terminal for signal output connected to the top end of the nth stripe electrode via a resistor;
    a fourth terminal for signal output connected to the top end of the first stripe electrode via a resistor;
    an electrode disposed on the rear surface of the semiconductor substrate; and
    an operation part for calculating the position of radiation using output signals obtained from the first to the fourth terminals for signal output as a result of application of radiation to given points on the semiconductor substrate, wherein
    the first to the nth stripe electrodes are separated from each other along the Y direction by grooves,
    the first to the nth stripe electrodes are formed by m pieces of strip electrodes arranged in the Y direction separated from each other,
    the strip electrodes placed adjacent to each other in the Y direction are connected via a resistor to form a stripe electrode,
    the ratio of the resistance value of each of the stripe electrodes and that of the resistors connecting the top ends and/or bottom ends of the stripe electrodes adjacent to each other falls within the 10:1 to 100:1 range, the operation part is calculating the temporary positional coordinates $(X_i, Y_j)$ of the radiation using the formulae (1) and (2) as shown below by obtaining output voltages V1, V2, V3, V4 using the output signals from the first to the fourth terminals for signal output and furthermore calculates the detected positional coordinates $(X_p, Y_q)$ of the radiation using the formulae (3) and (4) as shown below based on the temporary positional coordinates $(X_i, Y_j)$, and the resistance ratio is set to the value allowing the distortion of the temporary positional coordinates $(X_i, Y_j)$ in the Y direction to be suppressed and the detected current to be discriminated from noise current:

[Formula 1]

$$X_i = \frac{(V_2 + V_3) - (V_1 + V_4)}{V_1 + V_2 + V_3 + V_4} \quad (1)$$

[Formula 2]

$$Y_j = \frac{(V_4 + V_3) - (V_1 + V_2)}{V_1 + V_2 + V_3 + V_4} \quad (2)$$

[Formula 3]

$$X_p = f(X_i, Y_j) \quad (3)$$

[Formula 4]

$$Y_q = g(X_i, Y_j) \quad (4)$$

where, the functions $f(X_i, Y_j)$ and $g(X_i, Y_j)$ of the formulae (3) and (4) as shown above are found according to the following procedure: The radiation spots on the stripe electrodes of the semiconductor 2D position detector are irradiated in the Y direction at given intervals, the temporary positional coordinate of each irradiation position is calculated. Then assuming a corrective function for the positional coordinate of each irradiation position and the temporary positional coordinate of each irradiation position after calculating the temporary positional coordinate of each irradiation position, the above functions $f(X_i, Y_j)$ and $g(X_i, Y_j)$ are found by fitting as a function for reproducing the positional coordinate of each radiation irradiation position.

3. The semiconductor 2D position detector as set forth in claim 1 or 2, characterized in that the stripe electrodes are Schottky type electrodes having high electrically conductive resistivity, and the electrode disposed on the rear surface of the semiconductor substrate is an electrode having high electric conductivity.

4. The semiconductor 2D position detector as set forth in claim 1 or 2, characterized in that the semiconductor substrate is made of CdTe, CdZnTe or BrTl, and the electrode is made of indium or platinum.

5. The semiconductor 2D position detector as set forth in claim 1 or 2, characterized in that $Y_q$ is calculated by using the formulae (5) and (6) as shown below, assuming $X_p$ as $X_i$, to calculate the detected positional coordinates $(X_p, Y_q)$ of the radiation:

[Formula 5]

$$Y_q = g(X_i, Y_j) = d * \frac{Y_j}{aX_i^2 + bX_i + c} \quad (5)$$

where, coefficients a, b and c of the quadratic function are arbitrary constants, and d* is a normalization constant,

[Formula 6]

$$Y_{q'} = g(X_i, Y_j) = \frac{Y_j}{d'}(a' X_i^2 + b' X_i + c') \quad (6)$$

where, coefficients a', b' and c' of the quadratic function are arbitrary constants, and d' is a normalization constant.

6. The semiconductor 2D position detector as set forth in claim 1 or 2, characterized in that the resistance value of the resistors connected between the top ends and the bottom ends of the stripe electrodes are adjustable.

7. A positron emission tomographic apparatus characterized in that the semiconductor 2D position detector as set forth in any one of claims 1 and 2 is used.

8. The semiconductor 2D position detector as set forth in claim 1 or 2, characterized in that the first to the nth stripe electrodes are separated from each other with grooves along the X direction.

9. A method for detecting two-dimensional positions of radiation, characterized in that it comprises the steps of:
arranging a first to an nth (n is an integer of 2 or higher) stripe electrodes on the surface of a semiconductor substrate at a given intervals in the X direction and in parallel to the Y direction;
connecting all the top ends of the first to the nth stripe electrodes adjacent to each other via a resistor;
connecting all the bottom ends of the first to the nth stripe electrodes adjacent to each other via a resistor;
connecting one end of the resistor to the bottom end of the first stripe electrode whereas connecting a first terminal for signal output to the other end of the resistor;
connecting one end of the resistor to the bottom end of the nth stripe electrode whereas connecting a second terminal for signal output is connected to the other end of the resistor;
connecting one end of the resistor to the top end of the nth stripe electrode whereas connecting a third terminal for signal output to the other end of the resistor;
connecting one end of the resistor to the top end of the first stripe electrode whereas connecting a fourth terminal for signal output to the other end of the resistor;
disposing an electrode on the rear surface of the semiconductor substrate;
separating the first to the nth stripe electrodes from each other along the Y direction by grooves;
setting the ratio of the resistance value of each of the stripe electrodes and that of the resistors connecting the top ends and/or bottom ends of the stripe electrodes adjacent to each other falls within the 10:1 to 100:1 range;
obtaining the output signals from the radiation irradiated to the semiconductor substrate from the first to the fourth terminals for signal output;
calculating the temporary positional coordinates $(X_i, Y_j)$ of the radiation using the formulae (1) and (2) as shown below by obtaining output voltages V1, V2, V3, V4 using the output signals from the first to the fourth terminals for signal output and furthermore the detected positional coordinates $(X_p, Y_q)$ of the radiation are calculated using the formulae (3) and (4) as shown below based on the temporary positional coordinates $(X_i, Y_j)$; and setting the resistance ratio to the value allowing the distortion of the temporary positional coordinates $(X_i, Y_j)$ in the Y direction to be suppressed and the detected current to be discriminated from noise current:

[Formula 1]

$$X_i = \frac{(V_2 + V_3) - (V_1 + V_4)}{V_1 + V_2 + V_3 + V_4} \quad (1)$$

[Formula 2]

$$Y_j = \frac{(V_4 + V_3) - (V_1 + V_2)}{V_1 + V_2 + V_3 + V_4} \quad (2)$$

[Formula 3]

$$X_p = f(X_i, Y_j) \quad (3)$$

[Formula 4]

$$Y_q = g(X_i, Y_j) \quad (4)$$

where, the functions $f(X_i, Y_j)$ and $g(X_i, Y_j)$ of the formulae (3) and (4) as shown above are found according to the following procedure: The radiation spots on the stripe electrodes of the semiconductor 2D position detector are irradiated in the Y direction at given intervals, the temporary positional coordinate of each irradiation position is calculated. Then assuming a corrective function for the positional coordinate of each irradiation position and the temporary positional coordinate of each irradiation position after calculating the temporary positional coordinate of each irradiation position, the above functions $f(X_i, Y_j)$ and $g(X_i, Y_j)$ are found by fitting as a function for reproducing the positional coordinate of each radiation irradiation position.

10. The method for detecting two-dimensional positions of radiation as set forth in claim 9, characterized in that forming the first to the nth stripe electrodes by m pieces of strip electrodes arranged in the Y direction separated from each other, and connecting the strip electrodes of each stripe electrode adjacent to each other along the Y direction via a resistor to fabricate each of the stripe electrodes.

11. The method for detecting two-dimensional positions of radiation as set forth in claim 9, characterized in that calculating $Y_q$ assuming $X_p$ to be $X_i$ and using the formulae (5) and (6) as shown below:

[Formula 5]

$$Y_q = g(X_i, Y_j) = d * \frac{Y_j}{aX_i^2 + bX_i + c} \quad (5)$$

where, coefficients a, b and c of the quadratic function are arbitrary constants, and d* is a normalization constant,

[Formula 6]

$$Y_q = g(X_i, Y_j) = \frac{Y_j}{d'}(a'X_i^2 + b'X_i + c') \quad (6)$$

where, coefficients a', b' and c' of the quadratic function are arbitrary constants, and d' is a normalization constant.

\* \* \* \* \*